United States Patent
Yu et al.

(10) Patent No.: US 12,554,083 B2
(45) Date of Patent: Feb. 17, 2026

(54) OPTICAL DEVICES AND METHODS OF MANUFACTURE

(71) Applicant: Taiwan Semiconductor Manufacturing Co., Ltd., Hsinchu (TW)

(72) Inventors: Chen-Hua Yu, Hsinchu (TW); Hsing-Kuo Hsia, Jhubei (TW); Chih-Wei Tseng, Hsinchu (TW); Hua-Kung Chiu, Hsinchu (TW); Jui Lin Chao, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 214 days.

(21) Appl. No.: 18/455,886

(22) Filed: Aug. 25, 2023

(65) Prior Publication Data
US 2025/0067946 A1    Feb. 27, 2025

(51) Int. Cl.
  *H04B 10/00* (2013.01)
  *G02B 6/42* (2006.01)
  *H10H 20/01* (2025.01)

(52) U.S. Cl.
  CPC ........... *G02B 6/428* (2013.01); *G02B 6/4204* (2013.01); *G02B 6/4283* (2013.01); *G02B 6/4293* (2013.01); *H10H 20/01* (2025.01)

(58) Field of Classification Search
  CPC .... G02B 6/428; G02B 6/4204; G02B 6/4283; G02B 6/4293; H10H 20/01; H01S 5/0225; H01S 5/021
  See application file for complete search history.

(56) References Cited

U.S. PATENT DOCUMENTS

| | | | |
|---|---|---|---|
| 2008/0247703 A1* | 10/2008 | Kodama | G02B 6/4214 385/14 |
| 2019/0148254 A1* | 5/2019 | Na | H01L 24/26 257/774 |
| 2022/0077132 A1* | 3/2022 | Chen | H01L 23/3135 |
| 2022/0093579 A1* | 3/2022 | Kishimoto | H10H 20/018 |
| 2022/0149254 A1* | 5/2022 | Schuele | H01L 25/0753 |
| 2022/0231212 A1* | 7/2022 | Yasuda | H01L 24/05 |
| 2022/0328461 A1* | 10/2022 | Ichikawa | H10H 20/8585 |
| 2022/0344552 A1* | 10/2022 | Odawara | H10H 20/8506 |
| 2022/0357538 A1* | 11/2022 | Chang | G02B 6/4238 |
| 2022/0373734 A1* | 11/2022 | Duong | H01L 21/4853 |
| 2023/0161120 A1* | 5/2023 | Yu | G02B 6/4274 385/14 |

(Continued)

FOREIGN PATENT DOCUMENTS

TW  202246822 A  12/2022

*Primary Examiner* — Agustin Bello
(74) *Attorney, Agent, or Firm* — Slater Matsil, LLP

(57) ABSTRACT

Optical devices and methods of manufacture are presented herein. In an embodiment, an optical device is provided that includes an optical package having a first surface and a second surface opposite the first surface, a laser die package having a third surface and a fourth surface opposite the third surface, wherein the first surface is planar with the third surface and the second surface is planar with the fourth surface, a first silicon support attached to both the second surface and the fourth surface, and an interposer attached to both the first surface and the third surface, wherein the interposer is free of a silicon substrate.

20 Claims, 14 Drawing Sheets

(56) References Cited

U.S. PATENT DOCUMENTS

| | | | |
|---|---|---|---|
| 2023/0305244 A1* | 9/2023 | Shastri | H01L 25/167 |
| 2023/0384543 A1* | 11/2023 | Hsia | G02B 6/4204 |
| 2023/0402438 A1* | 12/2023 | Liu | H01L 25/162 |
| 2023/0408769 A1* | 12/2023 | Kuo | G02B 6/4204 |
| 2024/0072200 A1* | 2/2024 | Ishikawa | H10H 20/01 |
| 2024/0178206 A1* | 5/2024 | Lee | H01L 23/49838 |
| 2025/0004223 A1* | 1/2025 | Li | G02B 6/428 |
| 2025/0067946 A1* | 2/2025 | Yu | G02B 6/4204 |
| 2025/0208272 A1* | 6/2025 | Hamamatsu | G01C 3/06 |

\* cited by examiner

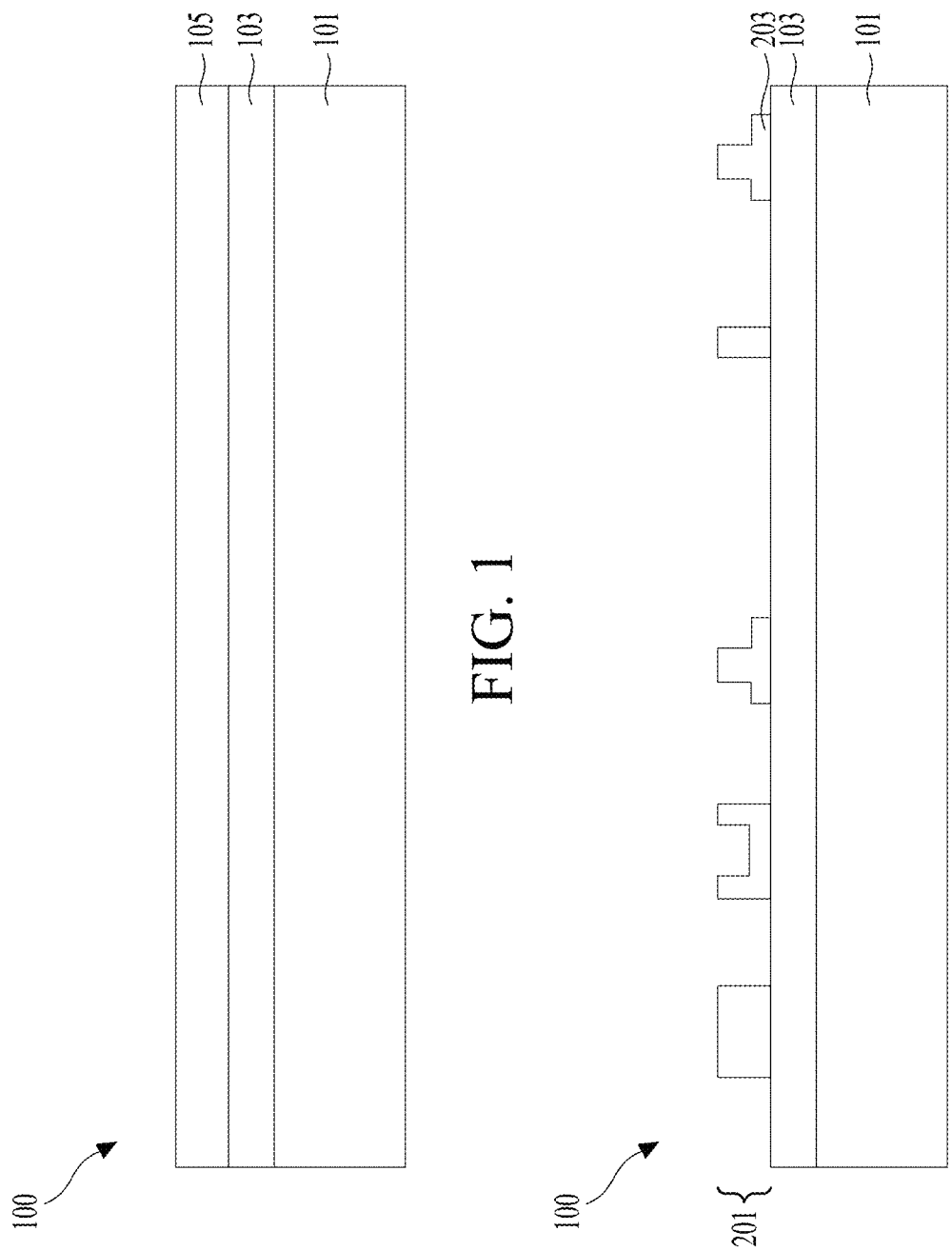

OPTICAL DEVICES AND METHODS OF MANUFACTURE

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating long-range optical components and short-range electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-9 illustrate formation of a first optical device comprising a singulated EIC over a PIC, in accordance with some embodiments.

DETAILED DESCRIPTION

Figure 3:
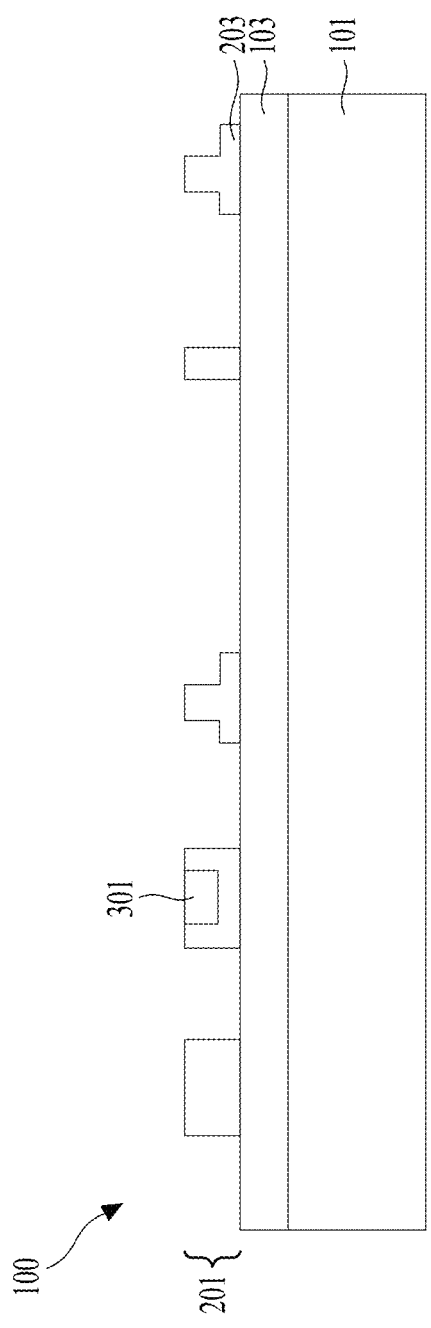

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be discussed with respect to certain embodiments in which at least one laser die and one optical engine are bonded to a thinned interposer and supported on an opposing side by a silicon support structure. The silicon support structure serving multiple functions including allowing for the removal of silicon from the typical interposer structure used in COUPE devices. However, the embodiments presented herein are intended to be illustrative and are not intended to limit the embodiments to the precise descriptions as discussed. Rather, the embodiments discussed may be incorporated into a wide variety of implementations, and all such implementations are fully intended to be included within the scope of the embodiments.

With reference now to FIG. 1, there is illustrated an initial structure of an optical interposer 100 (seen in FIG. 5), in accordance with some embodiments. In the particular embodiment illustrated in FIG. 1, the optical interposer 100 is a photonic integrated circuit (PIC) and comprises at this stage a first substrate 101, a first insulator layer 103, and a layer of material 105 for a first active layer 201 of first optical components 203 (not separately illustrated in FIG. 1 but illustrated and discussed further below with respect to FIG. 2). In an embodiment, at a beginning of the manufacturing process of the optical interposer 100, the first substrate 101, the first insulator layer 103, and the layer of material 105 for the first active layer 201 of first optical components 203 may collectively be part of a silicon-on-insulator (SOI) substrate. Looking first at the first substrate 101, the first substrate 101 may be a semiconductor material such as silicon or germanium, a dielectric material such as glass, or any other suitable material that allows for structural support of overlying devices.

The first insulator layer 103 may be a dielectric layer that separates the first substrate 101 from the overlying first active layer 201 and can additionally, in some embodiments, serve as a portion of cladding material that surrounds the subsequently manufactured first optical components 203 (discussed further below). In an embodiment the first insulator layer 103 may be silicon oxide, silicon nitride, germanium oxide, germanium nitride, combinations of these, or the like, formed using a method such as implantation (e.g., to form a buried oxide (BOX) layer) or else may be deposited onto the first substrate 101 using a deposition method such as chemical vapor deposition, atomic layer deposition, physical vapor deposition, combinations of these, or the like. However, any suitable material and method of manufacture may be used.

The material 105 for the first active layer 201 is initially (prior to patterning) a conformal layer of material that will be used to begin manufacturing the first active layer 201 of the first optical components 203. In an embodiment the material 105 for the first active layer 201 may be a translucent material that can be used as a core material for the desired first optical components 203, such as a semiconductor material such as silicon, germanium, silicon germanium, combinations of these, or the like, while in other embodiments the material 105 for the first active layer 201 may be a dielectric material such as silicon nitride or the like, although in other embodiments the material 105 for the first active layer 201 may be III-V materials, lithium niobate materials, or polymers. In embodiments in which the material 105 of the first active layer 201 is deposited, the material 105 for the first active layer 201 may be deposited using a method such as epitaxial growth, chemical vapor deposition, atomic layer deposition, physical vapor deposition, combinations of these, or the like. In other embodiments in which the first insulator layer 103 is formed using an implantation method, the material 105 of the first active layer 201 may initially be part of the first substrate 101 prior to the implantation process to form the first insulation layer 103. However, any suitable materials and methods of manufacture may be utilized to form the material 105 of the first active layer 201.

FIG. 2 illustrates that, once the material 105 for the first active layer 201 is ready, the first optical components 203 for the first active layer 201 are manufactured using the material 105 for the first active layer 201. In embodiments the first optical components 203 of the first active layer 201 may include such components as optical waveguides (e.g., ridge waveguides, rib waveguides, buried channel waveguides, diffused waveguides, etc.), couplers (e.g., grating couplers, edge couplers that are a narrowed waveguide with a width of between about 1 nm and about 200 nm, etc.), directional couplers, optical modulators (e.g., Mach-Zehnder silicon-photonic switches, microelectromechanical switches, micro-ring resonators, etc.), amplifiers, multiplexors, demultiplexors, optical-to-electrical converters (e.g., P-N junctions), electrical-to-optical converters, lasers, combinations of these, or the like. However, any suitable first optical components 203 may be used.

To begin forming the first active layer 201 of first optical components 203 from the initial material, the material 105 for the first active layer 201 may be patterned into the desired shapes for the first active layer 201 of first optical components 203. In an embodiment the material 105 for the first active layer 201 may be patterned using, e.g., one or more photolithographic masking and etching processes. However, any suitable method of patterning the material 105 for the first active layer 201 may be utilized. For some of the first optical components 203, such as waveguides or edge couplers, the patterning process may be all or at least most of the manufacturing that is used to form these first optical components 203.

FIG. 3 illustrates that, for those components that utilize further manufacturing processes, such as Mach-Zehnder silicon-photonic switches that utilize resistive heating elements, additional processing may be performed either before or after the patterning of the material for the first active layer 201. For example, implantation processes, additional deposition and patterning processes for different materials (e.g., resistive heating elements, III-V materials for converters), combinations of all of these processes, or the like, can be utilized to help further the manufacturing of the various desired first optical components 203. In a particular embodiment, and as specifically illustrated in FIG. 3, in some embodiments an epitaxial deposition of a semiconductor material 301 such as germanium (used, e.g., for electricity/optics signal modulation and transversion) may be performed on a patterned portion of the material 105 of the first active layer 201. In such an embodiment the semiconductor material 301 may be epitaxially grown in order to help manufacture, e.g., a photodiode for an optical-to-electrical converter. All such manufacturing processes and all suitable first optical components 203 may be manufactured, and all such combinations are fully intended to be included within the scope of the embodiments.

Figure 4:
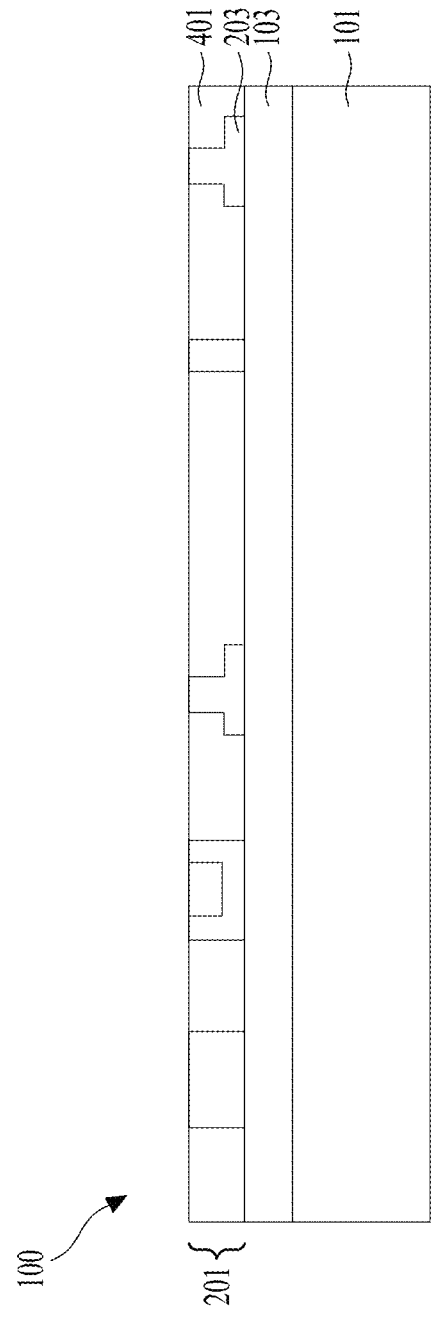

FIG. 4 illustrates that, once the individual first optical components 203 of the first active layer 201 have been formed, a second insulating layer 401 may be deposited to cover the first optical components 203 and provide additional cladding material. In an embodiment the second insulator layer 401 may be a dielectric layer that separates the individual components of the first active layer 201 from each other and from the overlying structures and can additionally serve as another portion of cladding material that surrounds the first optical components 203. In an embodiment the second insulator layer 401 may be silicon oxide, silicon nitride, germanium oxide, germanium nitride, combinations of these, or the like, formed using a deposition method such as chemical vapor deposition, atomic layer deposition, physical vapor deposition, combinations of these, or the like. Once the material of the second insulating layer 401 has been deposited, the material may be planarized using, e.g., a chemical mechanical polishing process in order to either planarize a top surface of the second insulating layer 401 (in embodiments in which the second insulating layer 401 is intended to fully cover the first optical components 203) or else planarize the second insulating layer 401 with top surfaces of the first optical components 203. However, any suitable material and method of manufacture may be used.

Figure 5:
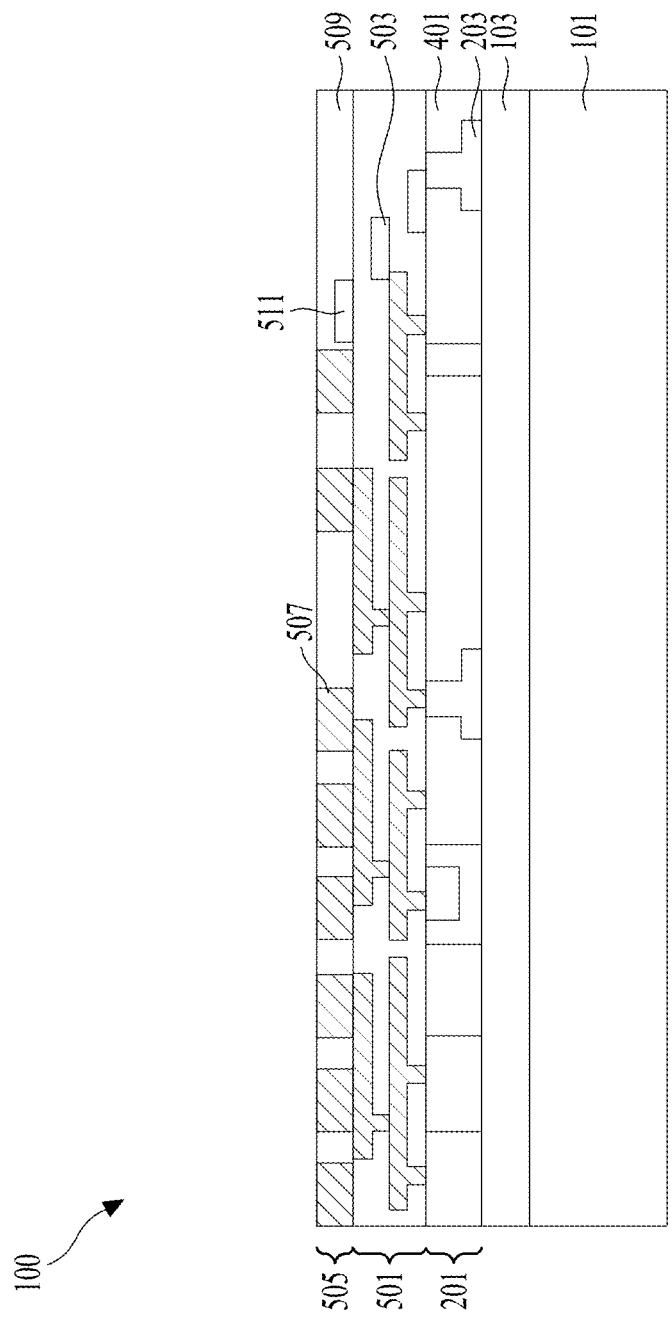

FIG. 5 illustrates that, once the first optical components 203 of the first active layer 201 have been manufactured and the second insulating layer 401 has been formed, first metallization layers 501 are formed in order to electrically connect the first active layer 201 of first optical components 203 to control circuitry, to each other, and to subsequently attached devices. In an embodiment the first metallization layers 501 are formed of alternating layers of dielectric and conductive material and may be formed through any suitable processes (such as deposition, damascene, dual damascene, etc.). In particular embodiments there may be multiple layers of metallization used to interconnect the various first optical components 203, but the precise number of first metallization layers 501 is dependent upon the design of the optical interposer 100.

Additionally, during the manufacture of the first metallization layers 501, one or more second optical components 503 may be formed as part of the first metallization layers 501. In some embodiments the second optical components 503 of the first metallization layers 501 may include such components as couplers (e.g., edge couplers, grating couplers, etc.) for connection to outside signals, optical waveguides (e.g., ridge waveguides, rib waveguides, buried channel waveguides, diffused waveguides, etc.), optical modulators (e.g., Mach-Zehnder silicon-photonic switches, microelectromechanical switches, micro-ring resonators, etc.), amplifiers, multiplexors, demultiplexors, optical-to-electrical converters (e.g., P-N junctions), electrical-to-optical converters, lasers, combinations of these, or the like.

However, any suitable optical components may be used for the one or more second optical components 503.

In an embodiment the one or more second optical components 503 may be formed by initially depositing a material for the one or more second optical components 503. In an embodiment the material for the one or more second optical components 503 may be a dielectric material such as silicon nitride, silicon oxide, combinations of these, or the like, or a semiconductor material such as silicon, deposited using a deposition method such as chemical vapor deposition, atomic layer deposition, physical vapor deposition, combinations of these, or the like. However, any suitable material and any suitable method of deposition may be utilized.

Once the material for the one or more second optical components 503 has been deposited or otherwise formed, the material may be patterned into the desired shapes for the one or more second optical components 503. In an embodiment the material of the one or more second optical components 503 may be patterned using, e.g., one or more photolithographic masking and etching processes. However, any suitable method of patterning the material for the one or more second optical components 503 may be utilized.

For some of the one or more second optical components 503, such as waveguides or edge couplers, the patterning process may be all or at least most manufacturing that is used to form these components. Additionally, for those components that utilize further manufacturing processes, such as Mach-Zehnder silicon-photonic switches that utilize resistive heating elements, additional processing may be performed either before or after the patterning of the material for the one or more second optical components 503. For example, implantation processes, additional deposition and patterning processes for different materials, combinations of all of these processes, or the like, and can be utilized to help further the manufacturing of the various desired one or more second optical components 503. All such manufacturing processes and all suitable one or more second optical components 503 may be manufactured, and all such combinations are fully intended to be included within the scope of the embodiments.

Once the one or more second optical components 503 of the first metallization layers 501 have been manufactured, a first bonding layer 505 is formed over the first metallization layers 501. In an embodiment, the first bonding layer 505 may be used for a dielectric-to-dielectric and metal-to-metal bond. In accordance with some embodiments, the first bonding layer 505 is formed of a first dielectric material 509 such as silicon oxide, silicon nitride, or the like. The first dielectric material 509 may be deposited using any suitable method, such as a chemical vapor deposition (CVD), high-density plasma chemical vapor deposition (HDPCVD), physical vapor deposition (PVD), atomic layer deposition (ALD), or the like. However, any suitable materials and deposition processes may be utilized.

Once the first dielectric material 509 has been formed, first openings in the first dielectric material 509 are formed to expose conductive portions of the underlying layers in preparation to form first bond pads 507 within the first bonding layer 505. Once the first openings have been formed within the first dielectric material 509, the first openings may be filled with a seed layer and a plate metal to form the first bond pads 507 within the first dielectric material 509. The seed layer may be blanket deposited over top surfaces of the first dielectric material 509 and the exposed conductive portions of the underlying layers and sidewalls of the openings and the second openings. The seed layer may comprise a copper layer. The seed layer may be deposited using processes such as sputtering, evaporation, or plasma-enhanced chemical vapor deposition (PECVD), or the like, depending upon the desired materials. The plate metal may be deposited over the seed layer through a plating process such as electrical or electro-less plating. The plate metal may comprise copper, a copper alloy, or the like. The plate metal may be a fill material. A barrier layer (not separately illustrated) may be blanket deposited over top surfaces of the first dielectric material 509 and sidewalls of the openings and the second openings before the seed layer. The barrier layer may comprise titanium, titanium nitride, tantalum, tantalum nitride, or the like.

Following the filling of the first openings, a planarization process, such as a CMP, is performed to remove excess portions of the seed layer and the plate metal, forming the first bond pads 507 within the first bonding layer 505. In some embodiments a bond pad via (not separately illustrated) may also be utilized to connect the first bond pads 507 with underlying conductive portions and, through the underlying conductive portions, connect the first bond pads 507 with the first metallization layers 501.

Additionally, the first bonding layer 505 may also include one or more third optical components 511 incorporated within the first bonding layer 505. In such an embodiment, prior to the deposition of the first dielectric material 509, the one or more third optical components 511 may be manufactured using similar methods and similar materials as the one or more second optical components 503 (described above), such as by being waveguides and other structures formed at least in part through a deposition and patterning process. However, any suitable structures, materials and any suitable methods of manufacture may be utilized.

Figure 6:
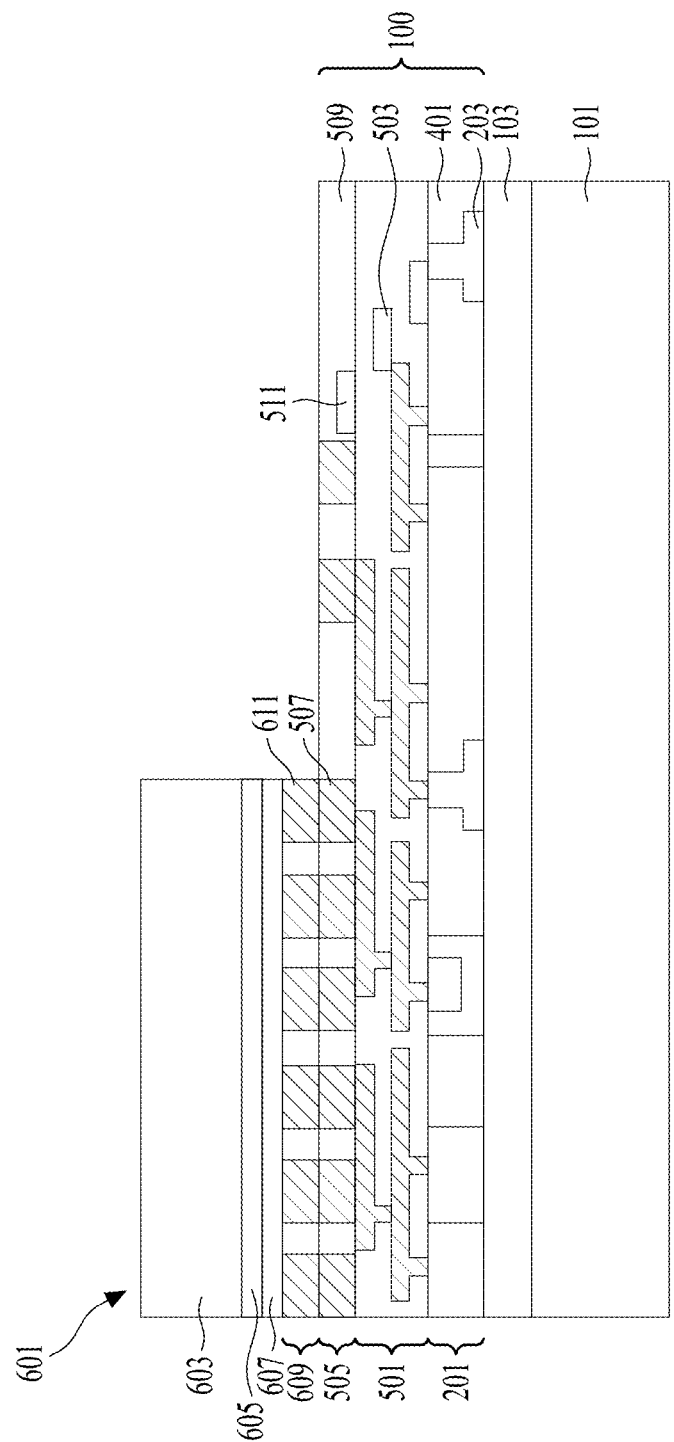

FIG. 6 illustrates that, once the optical interposer 100 has been formed, a first semiconductor device 601 may also be bonded to the optical interposer 100. In some embodiments, the first semiconductor device 601 is an electronic integrated circuit (EIC—e.g., a device without optical devices) and may have a first semiconductor substrate 603, a layer of first active devices 605, an overlying first interconnect structure 607, a second bonding layer 609, and associated second bond pads 611. In an embodiment the first semiconductor substrate 603 may be similar to the first substrate 101 (e.g., a semiconductor material such as silicon or silicon germanium), the first active devices 605 may be transistors, capacitors, resistors, and the like formed over the first semiconductor substrate 603, the first interconnect structure 607 may be similar to the first metallization layers 501 (without optical components), the second bonding layer 609 may be similar to the first bonding layer 505, and the second bond pads 611 may be similar to the first bond pads 507. However, any suitable devices may be utilized.

In an embodiment the first semiconductor device 601 may be configured to work with the optical interposer 100 for a desired functionality. In some embodiments the first semiconductor device 601 may be a high bandwidth memory (HBM) module, an xPU, a logic die, a 3DIC die, a CPU, a GPU, a SoC die, a MEMS die, combinations of these, or the like. Any suitable device with any suitable functionality, may be used, and all such devices are fully intended to be included within the scope of the embodiments.

Once the first semiconductor device 601 has been prepared, the first semiconductor device 601 may be bonded to the optical interposer 100. In an embodiment the first semiconductor device 601 may be bonded to the optical interposer 100 using, e.g., a dielectric-to-dielectric and metal-to-metal bonding process. In such an embodiment the first semiconductor device 601 is bonded to the first bonding layer 505 of the optical interposer 100 by bonding both the first bond pads 507 to the second bond pads 611 and by bonding the dielectrics within the first bonding layer 505 to the dielectrics within the second bonding layer 609. In this embodiment the top surfaces of the first semiconductor device 601 and the optical interposer 100 may first be activated utilizing, e.g., a dry treatment, a wet treatment, a plasma treatment, exposure to an inert gas, exposure to $H_2$, exposure to $N_2$, exposure to $O_2$, or combinations thereof, as examples. However, any suitable activation process may be utilized.

After the activation process the first semiconductor device 601 and the optical interposer 100 may be cleaned using, e.g., a chemical rinse, and then the first semiconductor device 601 is aligned and placed into physical contact with the optical interposer 100. The first semiconductor device 601 and the optical interposer 100 are then subjected to thermal treatment and contact pressure to bond the first semiconductor device 601 and the optical interposer 100. For example, the first semiconductor device 601 and the optical interposer 100 may be subjected to a pressure of about 200 kPa or less, and a temperature between about 25° C. and about 250° C. to fuse the first semiconductor device 601 and the optical interposer 100. The first semiconductor device 601 and the optical interposer 100 may then be subjected to a temperature at or above the eutectic point for material of the first bond pads 507, e.g., between about 150° C. and about 650° C., to fuse the metal bond pads. In this manner, the first semiconductor device 601 and the optical interposer 100 form a bonded device. In some embodiments, the bonded dies are subsequently baked, annealed, pressed, or otherwise treated to strengthen or finalize the bond.

Additionally, while the above description describes a dielectric-to-dielectric and metal-to-metal bonding process, this is intended to be illustrative and is not intended to be limiting. In yet other embodiments, the optical interposer 100 may be bonded to the first semiconductor device 601 by metal-to-metal bonding, or another bonding process. For example, the first semiconductor device 601 and the optical interposer 100 may be bonded by metal-to-metal bonding that is achieved by fusing conductive elements. Any suitable bonding process may be utilized, and all such methods are fully intended to be included within the scope of the embodiments.

Figure 7:
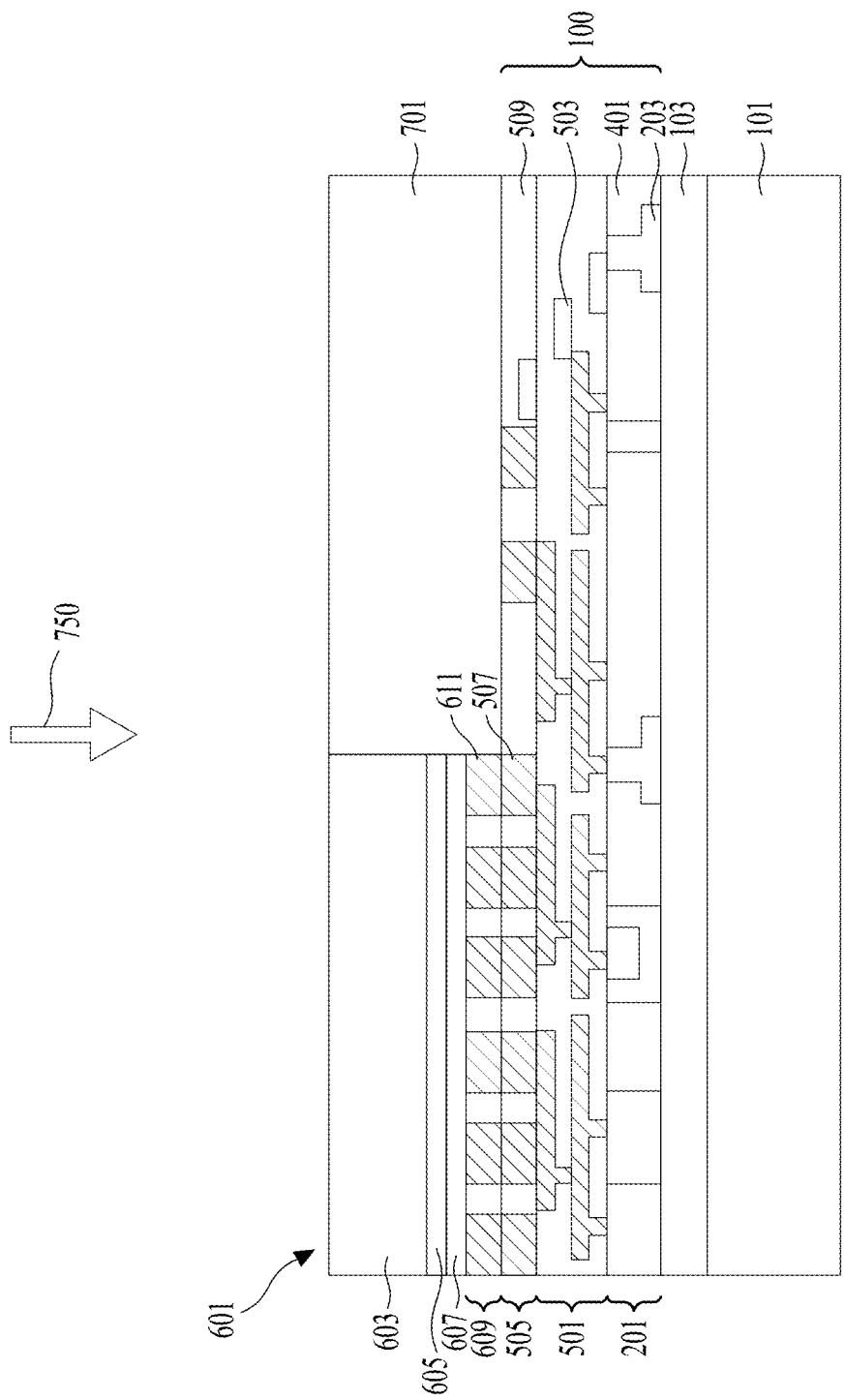

FIG. 7 illustrates that, once the first semiconductor device 601 has been attached to the optical interposer 100, a first gap-fill material 701 (also referred to as an insulating material) may be deposited in order to fill and overfill spaces around the first semiconductor device 601 and provide additional support. In an embodiment the first gap-fill material 701 may be a material such as silicon oxide, silicon nitride, silicon oxynitride, combinations of these, or the like. However, any suitable material and method of deposition may be utilized.

Once the first gap-fill material 701 has been deposited, the first gap-fill material 701 may be planarized through a first planarization process 750 in order to expose the first semiconductor device 601. Once planarized, top surfaces of the first semiconductor device 601 and the first gap-fill material 701 are substantially coplanar after the first planarization process 750 within process variations. In an embodiment, the first planarization process 750 may be a CMP process, a grinding process, or the like. However, any suitable planarization process may be utilized.

Figure 8:
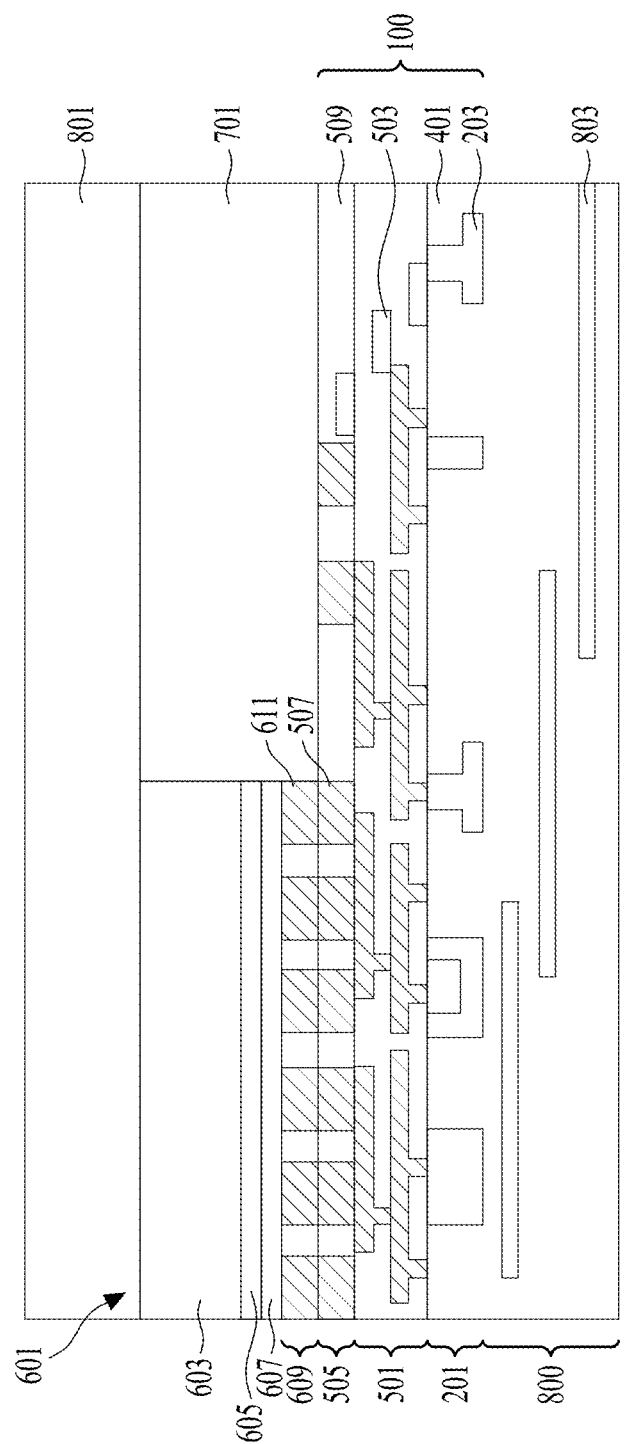

FIG. 8 illustrates that, once the top surfaces of the first semiconductor device 601 and the first gap-fill material 701 have been planarized, a second substrate 801 is attached to the top surfaces of the first semiconductor device 601 and the first substrate 101 and the first insulative layer 103 are removed. In an embodiment, the second substrate 801 supports the removal of the first substrate 101 and the first insulative layer 103 as well as formation of subsequent structures over the now exposed first active layer 201. In an embodiment the second substrate 801 may comprise of a silicon, such as a bulk silicon and may be attached using either a bonding process or a separate adhesive. Additionally, the first substrate 101 and the first insulative layer 103 may be removed using a planarization process (e.g., a CMP) or one or more etching processes. Any suitable methods may be used to attach the second substrate 801 and remove the first substrate 101 and the first insulative layer 103.

FIG. 8 further illustrates that, once the first substrate 101 and the first insulative layer 103 have been removed, a second active layer 800 with fourth optical components 803 may be formed over the first active layer 201. In an embodiment, the second active layer 800 may be formed in a similar manner and from similar materials as discussed above with respect to the second optical components 503 of the first metallization layers 501. In an embodiment, the fourth optical components 803 may be formed in a similar manner and from similar materials as discussed above with respect to the second optical components 503. However, any suitable method or materials may be utilized in the formation of the second active layer 800 and the fourth optical components 803.

Figure 9:
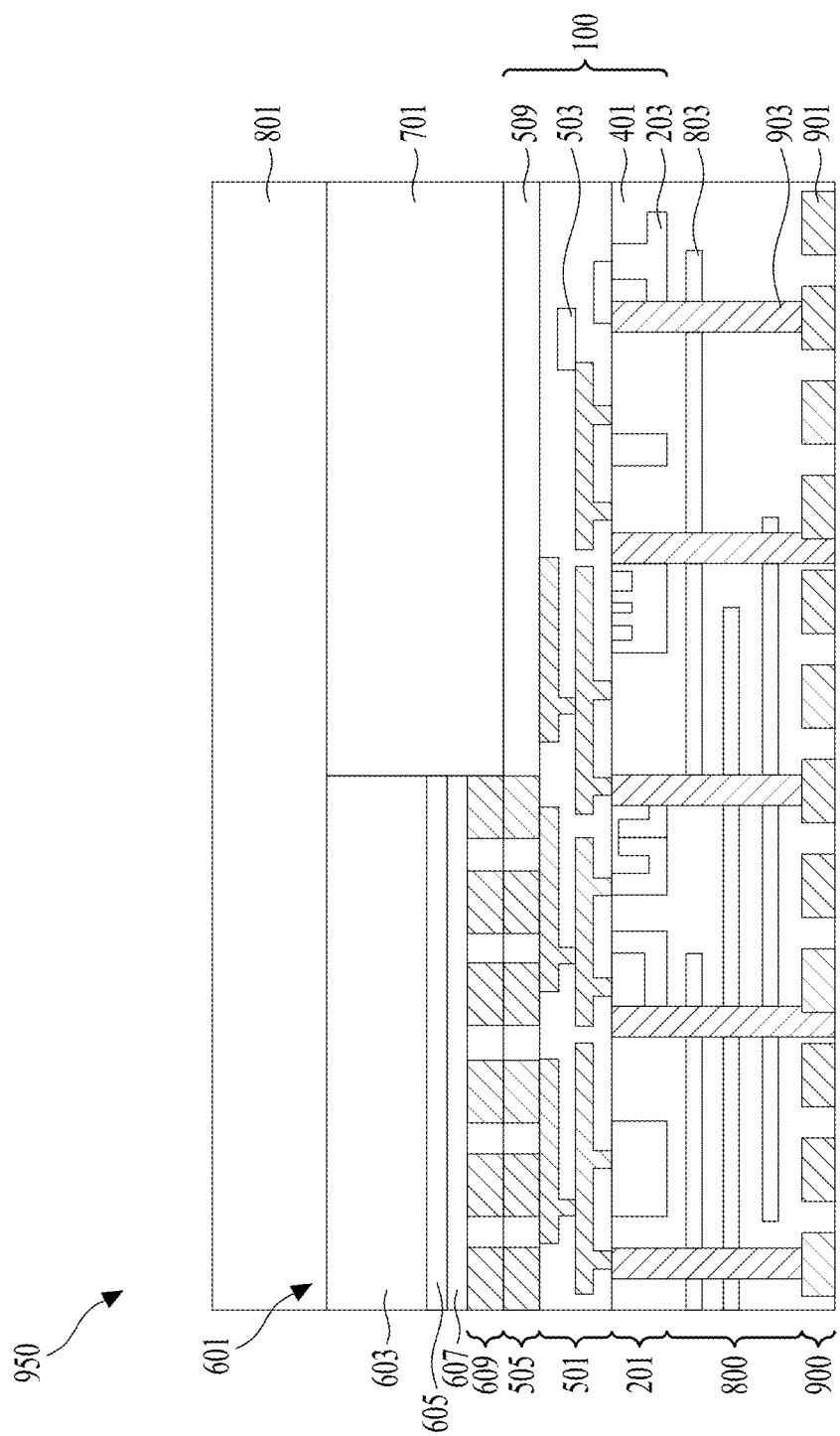

FIG. 9 illustrates that, once the second active layer 800 has been formed, a third bonding layer 900 may be formed with third bond pads 901 and first through device vias (TDVs) 903 may be formed (resulting in a structure that may be referred to as a first optical device 950). In an embodiment the first TDVs 903 extend through the second active layer 800 and the first active layer 201 so as to provide a quick passage of power, data, and ground through the optical interposer 100. In an embodiment the first TDVs 903 may be formed by initially forming through device via openings into the optical interposer 100. The through device via openings may be formed by applying and developing a suitable photoresist (not shown), and removing portions of the second active layer 800 and the optical interposer 100 that are exposed.

Once the through device via openings have been formed within the optical interposer 100, the through device via openings may be lined with a liner. The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition (PVD) or a thermal process, may alternatively be used.

Once the liner has been formed along the sidewalls and bottom of the through device via openings, a barrier layer (also not independently illustrated) may be formed and the remainder of the through device via openings may be filled with first conductive material. The first conductive material may comprise copper, although other suitable materials such as aluminum, alloys, doped polysilicon, combinations thereof, and the like, may be utilized. The first conductive material may be formed by electroplating copper onto a seed layer (not shown), filling and overfilling the through device via openings. Once the through device via openings have been filled, excess liner, barrier layer, seed layer, and first conductive material outside of the through device via openings may be removed through a planarization process such as chemical mechanical polishing (CMP), although any suitable removal process may be used.

Optionally, in some embodiments once the first TDVs 903 have been formed, second metallization layers (not separately illustrated in FIG. 9) may be formed in electrical connection with the first TDVs 903. In an embodiment the second metallization layers may be formed as described above with respect to the first metallization layers 501, such as being alternating layers of dielectric and conductive materials using damascene processes, dual damascene process, or the like. In other embodiments, the second metallization layers may be formed using a plating process to form and shape conductive material, and then cover the conductive material with a dielectric material. However, any suitable structures and methods of manufacture may be utilized.

FIG. 9 further illustrates a formation of the third bonding layer 900 with the third bond pads 901. In an embodiment, the third bonding layer 900 may be formed in a similar manner and from similar materials as discussed above with respect to the first bonding layer 505, the second bonding layer 609, etc. In an embodiment, the third bond pads 901 may be formed in a similar manner and from similar materials as discussed above with respect to the first bond pads 507, the second bond pads 611, etc. However, any suitable method or materials may be utilized in the formation of the third bonding layer 900 and the third bond pads 901. Additionally, in an embodiment, the third bond pads 901 may be in electrical connection with the first TDVs 903 and the second metallization layers as to provide electrical connection into and out of the first optical device 950.

Figure 10:
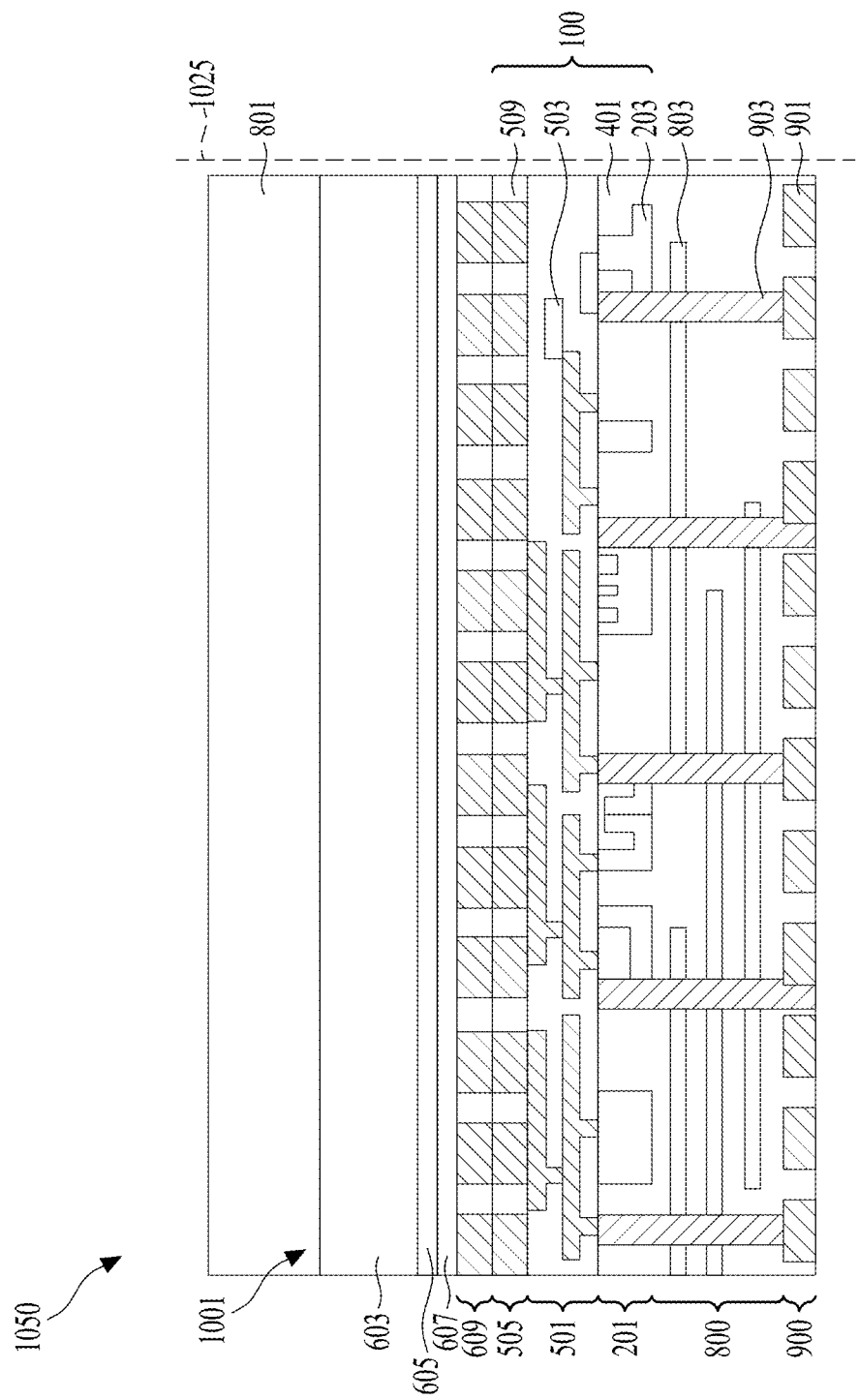
FIG. 10 illustrates a second optical device with an EIC and PIC bonded at the wafer scale and singulated to form the individual optical device, in accordance with some embodiments.

FIG. 10 illustrates an embodiment in which the optical device is wafer formed. In this embodiment, one or more second semiconductor devices 1001 are formed in a similar manner with similar structures and from similar materials as the first semiconductor device 601 and are formed as part of a first wafer (only a portion of which is illustrated), the optical interposer 100 is formed in a similar manner and from similar materials as discussed above and is formed as part of a second wafer (not separately illustrated). In this embodiment, the first wafer may be bonded to the second wafer in a similar manner as discussed above with respect to the bonding of the first bonding layer 505 to the second bonding layer 609. Following the bonding of the first wafer to the second wafer, a singulation process 1025 may be performed to form individual optical devices (which may be referred to as second optical device 1050) from the bonded wafers. In an embodiment, the singulation process 1025 may be a sawing process. However any suitable singulation process may be utilized. Following the singulation process 1025, sidewalls of the second optical device 1050 may be substantially coplanar within process variations. In this embodiment, the second active layer 800, the third bonding layer 900, and the first TDVs 903 may be wafer formed or formed after the singulation process 1025.

Figure 11:
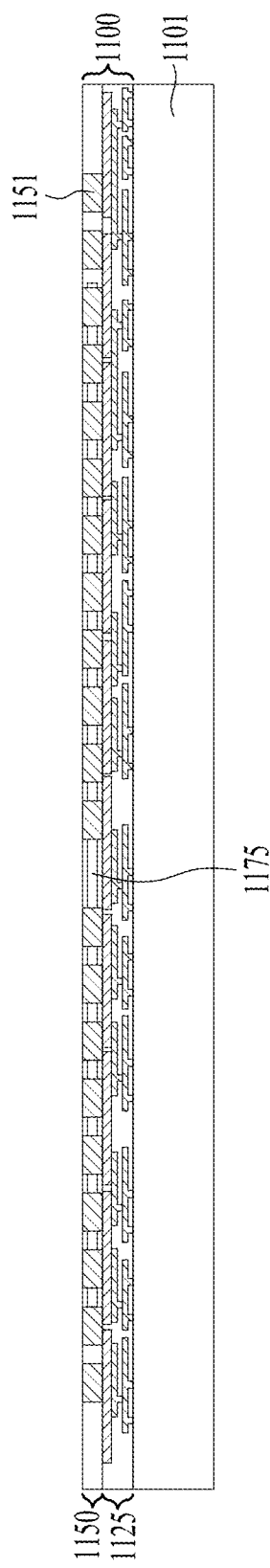
FIG. 11 illustrates a formation of a first redistribution structure of an optical package interposer, in accordance with some embodiments.

FIG. 11 illustrates a formation of a first redistribution structure 1100, to which various optical devices may be subsequently attached to (e.g., the first optical device 950, the second optical device 1050, etc., see FIGS. 12 and 15, respectively) as well as subsequently illustrated laser die 1200 (see FIG. 12). In an embodiment, the first redistribution structure 1100 may be formed over a third substrate 1101, where the third substrate 1101 may provide support for subsequent processing steps. In an embodiment, the first redistribution structure 1100 may comprise third metallization layers 1125 and a fourth bonding layer 1150. The third metallization layers 1125 may be formed in a similar manner and from similar materials as discussed above with respect to the first metallization layers 501. Additionally, the fourth bonding layer 1150 may be formed in a similar manner and from similar materials as discussed above with respect to the first bonding layer 505. Further, in an embodiment, the fourth bonding layer 1150 also includes fourth bond pads 1151, which may be formed in a similar manner and from similar materials as discussed above with respect to the first bond pads 507. In an embodiment, the first redistribution structure 1100 may also include fifth optical components 1175, which may be formed in a similar manner and from similar materials as discussed above with respect to the second optical components 503.

In an embodiment, the first redistribution structure 1100 is formed in order to electrically connect optical devices (e.g., the first optical device 950, the second optical device 1050) to the laser die 1200, to control circuitry, to each other, and to subsequently attached structures. Further, in an embodiment, the fifth optical components 1175 may be utilized for optical connection between the optical devices and the laser die 1200 or may provide other signal related functions.

Figure 12:
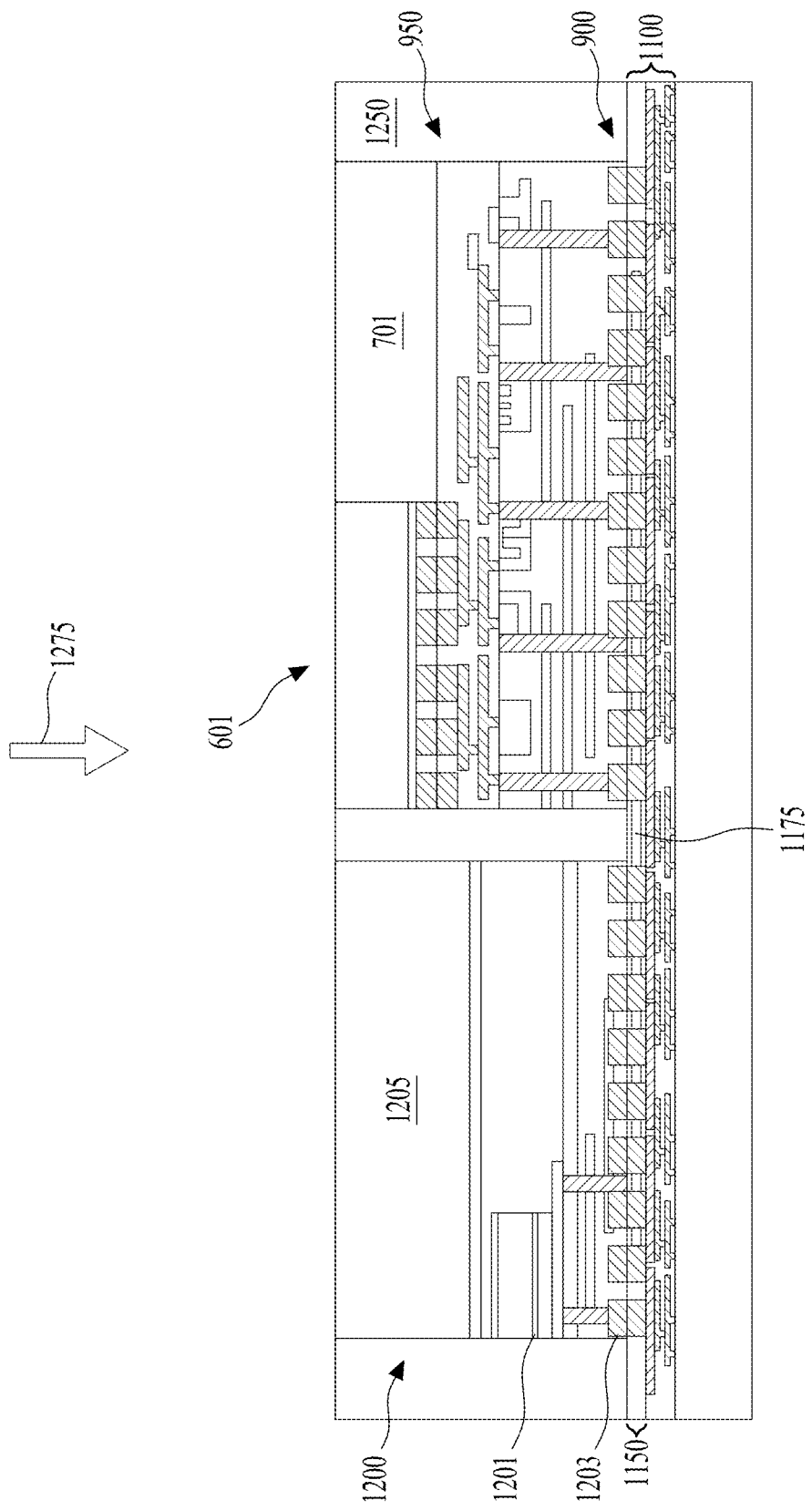
FIGS. 12-14 illustrate formation of the first optical package with a top support structure and a thinned optical package interposer, in accordance with some embodiments.

FIG. 12 illustrates that, after the formation of the first redistribution structure 1100, the first optical device 950 and the laser die 1200 may be attached to the first redistribution structure 1100. In an embodiment, the laser die 1200 is bonded to the first redistribution structure 1100 to provide a power source for the first optical device 950. In some embodiments, the laser die 1200 may comprise light generating structures such as one or more laser diodes 1201 surrounded by dielectric and/or cladding material over a first support substrate 1205. In an embodiment, the first support substrate 1205 may comprise a silicon material, such as a bulk silicon. In particular embodiments the laser diodes may be Fabry-Perot Diodes, and may be based on III-V materials, II-VI materials, or any other suitable set of materials.

In a particular embodiment the one or more laser diodes 1201 may comprise a first contact, a first buffer layer, a first active diode layer comprising multiple quantum wells (MQWs), a second buffer layer, and a second contact (only some of which are illustrated in FIG. 12 for clarity) in order to generate the desired light. Additionally, the generated light may be output from the laser die 1200 through, e.g., the first contact and associated waveguides. However, any suitable structures may be utilized in order to form the one or more laser diodes 1201 and generate the desired light.

Additionally, the laser die 1200 may also comprise fifth bond pads 1203. In an embodiment the fifth bond pads 1203 may be similar to the first bond pads 507. In an embodiment the fifth bond pads 1203 may be contact pads. However, any suitable materials and shape of connections may also be utilized for the fifth bond pads 1203.

Once the laser die 1200 has been formed and/or otherwise received, the laser die 1200 may be bonded to the first redistribution structure 1100. In an embodiment the laser die 1200 may be bonded to the first redistribution structure 1100 using a dielectric-to-dielectric and metal-to-metal, similar to the bonding process described above with respect to the first bonding layer 505 and the second bonding layer 609. However, any suitable bonding process may be utilized.

In an embodiment, desired light is generated by the laser die 1200 and coupled into the first redistribution structure 1100. The first redistribution structure 1100 receives the light and routes the light through the fifth optical components 1175 to the first optical device 950.

FIG. 12 also illustrates the attachment of the first optical device 950 to the first redistribution structure 1100. In an embodiment, the first optical device 950 may be attached to the first redistribution structure 1100 prior to the attachment of the laser die 1200 to the first redistribution structure 1100, simultaneously to the attachment of the laser die 1200 to the first redistribution structure 1100, or after the attachment of the laser die 1200 to the first redistribution structure 1100. In an embodiment, the first optical device 950 is attached to the first redistribution structure 1100 by bonding the third bonding layer 900 to the fourth bonding layer 1150 in a similar manner as discussed above with respect to the bonding of the first bonding layer 505 to the second bonding layer 609. However, any suitable method of bonding or attachment may be utilized to attach the first optical device 950 to the first redistribution structure 1100.

Following the attachment of the laser die 1200 and the first optical device 950 to the first redistribution structure 1100, a second gap-fill material 1250 may be deposited in order to fill and overfill spaces around the first optical device 950 and the laser die 1200 as well as provide additional support. In an embodiment, the second gap-fill material 1250 may be deposited and formed from a similar material as the first gap-fill material 701. However, any suitable material and method of deposition may be utilized in depositing the second gap-fill material 1250. Following the deposition of the second gap-fill material 1250 a second planarization process 1275 may be performed in order to remove excess portions of the second gap-fill material 1250. In an embodiment, the second substrate 801 may be removed by the second planarization process 1275. In this embodiment, top surfaces of the first semiconductor device 601, the first gap-fill material 701, the second gap-fill material 1250, and the first support substrate 1205 are substantially coplanar after the second planarization process 1275 within process variations, where these top surfaces may jointly be referred to as a first planar top surface. In an embodiment, the second planarization process 1275 may be a CMP process, a grinding process, or the like. However, any suitable planarization process may be utilized.

Figure 13:
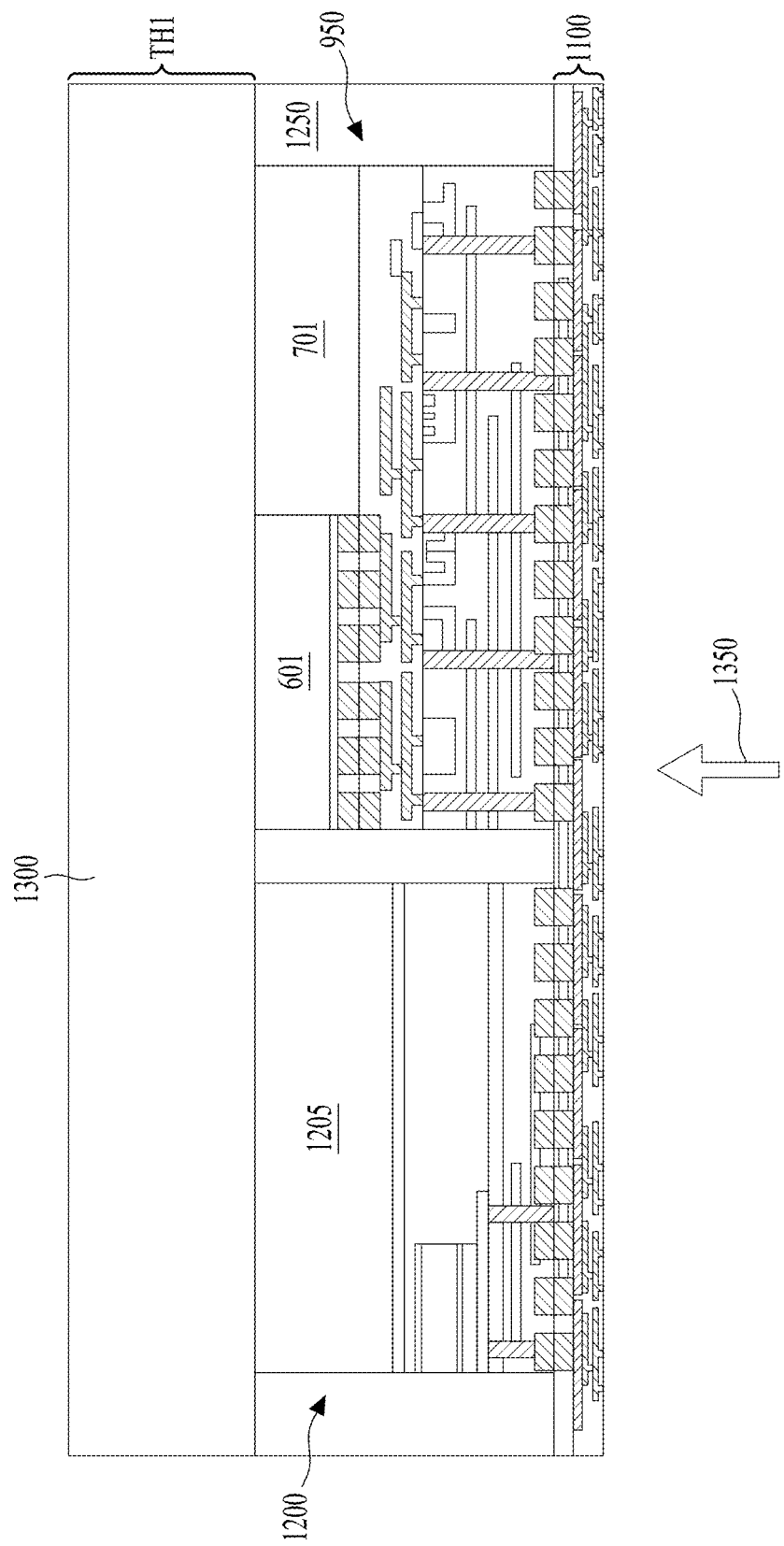

FIG. 13 illustrates that, following the second planarization process 1275 a second support substrate 1300 may be attached to the first planar top surface. In an embodiment, the second support substrate 1300 may comprise a silicon, such as a bulk silicon. Further, in an embodiment, the second support substrate 1300 may be attached to the first planar top surface through a first bonding process, such as a direct bonding process (e.g., a bonding process between the silicon of the first support substrate 1205, the semiconductor material of the first semiconductor substrate 603, and the silicon of the second support substrate 1300) or by a fusion bonding process (e.g., between the silicon of the second support substrate 1300 and an oxide or nitride of the first gap-fill material 701 and the second gap-fill material 1250), the like, or a combination thereof. In an embodiment, the first bonding process may comprise activating the first planar top surface and a bonding surface of the second support substrate 1300. The first planar top surface may be activated utilizing, e.g., a dry treatment, a wet treatment, a plasma treatment, exposure to an inert gas, exposure to $H_2$, exposure to $N_2$, exposure to $O_2$, or combinations thereof, as examples. However, any suitable activation process may be utilized.

After the activation process the first planar top surface and the second support substrate 1300 may be cleaned using, e.g., a chemical rinse, and then the second support substrate 1300 is aligned and placed into physical contact with the first planar top surface. The second support substrate 1300 and the first planar top surface may then be subjected to a thermal treatment and contact pressure to bond the second support substrate 1300 to the laser die 1200 and the first optical device 950. For example, the second support substrate 1300 and the first planar top surface may be subjected to a pressure of about 200 kPa or less, and a temperature between about 25° C. and about 250° C. to fuse the second support substrate 1300 to the first planar top surface. In this manner, the second support substrate 1300 and the laser die 1200 and the first optical device 950 form a bonded device. In some embodiments, the bonded structures are subsequently baked, annealed, pressed, or otherwise treated to strengthen or finalize the bond.

In an embodiment, the second support substrate 1300 may be formed to a first thickness $TH_1$, the first thickness $TH_1$ in a range of 700 millimeters (mm) to 1,500 mm. If the thickness of the second support substrate 1300 is less than the first thickness $TH_1$, than the second support substrate 1300 may be too thin to be adequately interfaced with for machine handling for subsequent processing as well as too thin to adequately support long term stability of the final optical package structure. If the thickness of the second support substrate 1300 is greater than the first thickness $TH_1$, than the second support substrate 1300 may be too thick to adequately interface with for machine handling for subsequent processing as well as be too thick for desired functionality of the final optical package structure with respect to light transmission through the second support substrate 1300.

FIG. 13 further illustrates that, after the attachment of the second support substrate 1300, the third substrate 1101 may be removed from the first redistribution structure 1100. In an embodiment, the third substrate 1101 may be removed by a third planarization process 1350. In an embodiment, the third planarization process 1350 may be a CMP process, a grinding process, or the like, or a combination thereof. In one embodiment, a first portion of the third substrate 1101 (e.g., a bulk portion of the third substrate 1101 material) is removed by a grinding process, and a second portion of the third substrate 1101 (e.g., a more controlled removal) is removed by a CMP process. However, any suitable planarization process may be utilized. In an embodiment, following the third planarization process 1350, conductive material of the first redistribution structure 1100 is exposed.

Figure 14:
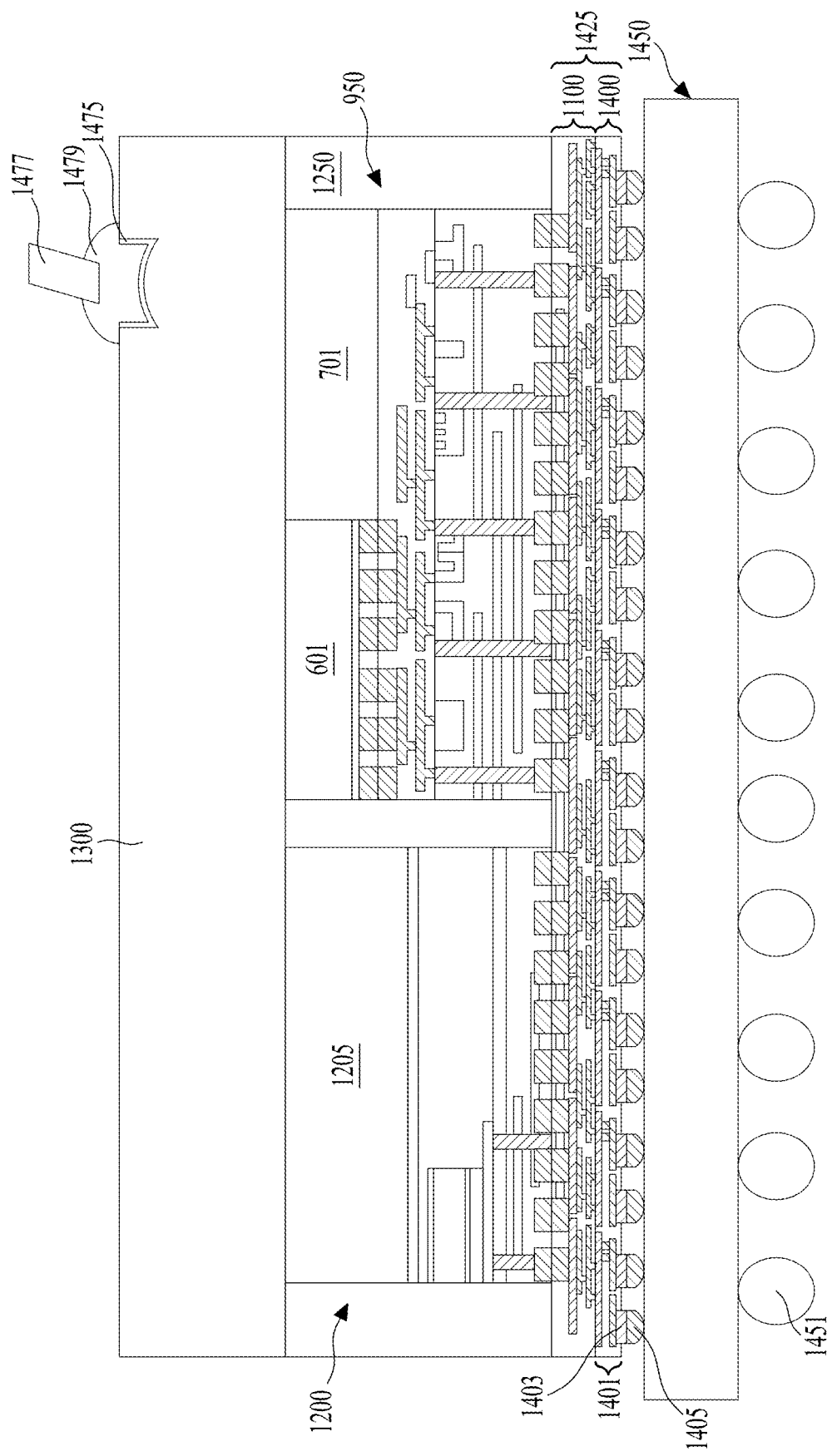

FIG. 14 illustrates that, following the removal of the third substrate 1101, a second redistribution structure 1400 may be formed over the exposed first redistribution structure 1100 and electrically coupled to the conductive material of the first redistribution structure 1100. In an embodiment, the second redistribution structure comprises fourth metallization layers 1401 with a first under-bump metallizations (UBMs) 1403. In an embodiment, first external connectors 1405 may be formed on the second redistribution structure 1400 over the first UBMs 1403.

In an embodiment, the fourth metallization layers 1401 may be formed in a similar manner and from similar materials as the first metallization layers 501. In an embodiment the first external connectors 1405 may be placed on the first UBMs 1403 in electrical connection with the first redistribution structure 1100 and may be, e.g., a ball grid array (BGA) which comprises a eutectic material such as solder, although any suitable materials may be used. In an embodiment in which the first external connectors 1405 are solder bumps or micro-bumps, the first external connectors 1405 may be formed using a ball drop method, such as a direct ball drop process. In another embodiment, the solder bumps or micro-bumps may be formed by initially forming a layer of tin through any suitable method such as evaporation, electroplating, printing, solder transfer, and then performing a reflow in order to shape the material into the desired bump shape. Once the first external connectors 1405 have been formed, a test may be performed to ensure that the structure is suitable for further processing. The combined structure of the first redistribution structure 1100 and the second redistribution structure 1400 may be referred to as a first interposer 1425. In an embodiment, the first interposer 1425 may be free from a bulk silicon (e.g., free from a silicon substrate) and may additionally be free from through silicon vias (e.g., free from vias extending through a bulk silicon).

In an embodiment, the first interposer 1425 may be formed to a second thickness $TH_2$, the second thickness $TH_2$ in a range of 10 μm to 150 μm. If the thickness of the first interposer 1425 is less than the second thickness $TH_2$ than the first interposer 1425 may be too thin to adequately support structures bonded to the first interposer 1425 and may have inadequate structural reliability. If the thickness of the first interposer 1425 is greater than the second thickness $TH_2$ than inadequate electrical loss, inadequate parasitic capacitance, and inadequate data rate transmission may occur across the first interposer 1425.

FIG. 14 further illustrates that, following the formation of the first external connectors 1405, the first interposer 1425, supporting the first optical device 950 and the laser die 1200, may be bonded to a package substrate 1450 with, e.g., the first external connectors 1405. In an embodiment the package substrate 1450 may be a package substrate, which may be a printed circuit board (PCB) or the like. The package substrate 1450 may include one or more dielectric layers and electrically conductive features, such as conductive lines and vias. In some embodiments, the package substrate 1450 may include through-vias, active devices, passive devices, and the like. The package substrate 1450 may further include conductive pads formed at the upper and lower surfaces of the package substrate 1450.

The first external connectors 1405 may be aligned with corresponding conductive connections on the package substrate 1450. Once aligned the first external connectors 1405 may then be reflowed in order to bond the package substrate 1450 to the first interposer 1425. However, any suitable bonding process may be used to connect the first interposer 1425 to the package substrate 1450. In some embodiments, an underfill material 1501 (not illustrated in FIG. 14, but illustrated in FIG. 15) may be deposited between the first external connectors 1405 and the package substrate 1450 to provide joint support around the first external connectors 1405.

Additionally, the package substrate 1450 may be prepared for further by placing by forming second external connectors 1451 on an opposite side of the package substrate 1450 from the first interposer 1425. In an embodiment the second external connectors 1451 may be formed using similar processes and materials as the first external connectors 1405. However, any suitable materials and processes may be utilized.

In an embodiment, FIG. 14 additionally illustrates the second support substrate 1300 comprises a coupling lens 1475 positioned to facilitate movement from an optical fiber 1477 to a grating coupler within, e.g., the first optical components 203, the second optical components 503 of the first metallization layers 501, or the third optical components 511. In an embodiment the coupling lens 1475 may be formed by shaping the material of the second support substrate 1300 (e.g., silicon) using masking and etching processes. However, any suitable process may be utilized. The optical fiber 1477 may be held in place using, e.g., an optical glue 1479. In some embodiments, the optical glue 1479 comprises a polymer material such as epoxy-acrylate oligomers, and may have a refractive index between about 1 and about 3. However, any suitable material may be utilized.

Additionally, while the optical fiber 1477 is illustrated as being attached at this point in the manufacturing process, this is intended to be illustrative and is not intended to be limiting. Rather, the optical fiber 1477 may be attached at any suitable point in the process, such as after subsequent encapsulations (described further below). Any suitable point of attachment may be utilized, and all such attachments at any point in the process are fully intended to be included within the scope of the embodiments.

Figure 15:
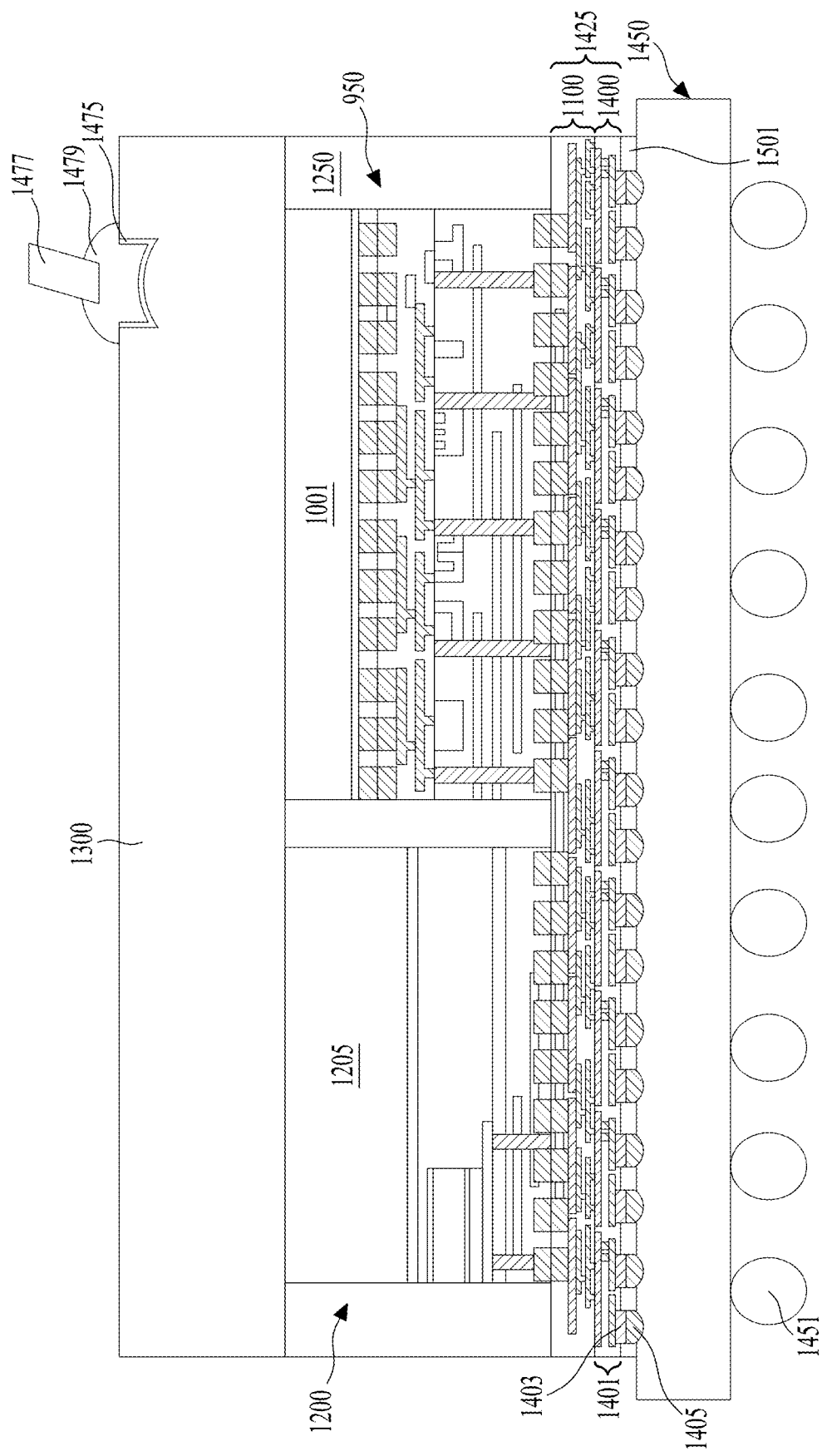
FIG. 15 illustrates an embodiment of a first optical package with the top support structure and a thinned optical package interposer utilizing wafer formation processing to form the optical device of the first optical package, in accordance with some embodiments.

FIG. 15 illustrates an alternative embodiment to the final structure illustrated in FIG. 14, where rather than bonding the first optical device 950 to the first interposer 1425, the second optical device 1050 is bonded to the first interposer 1425. In this embodiment, the second planarization process 1275 planarizes top surfaces of the second semiconductor device 1001, the second gap-fill material 1250, and the first support substrate 1205, wherein after the second planarization process 1275 these top surfaces are substantially coplanar within process variations and may jointly be referred to as a second planar top surface. In this embodiment, the second support substrate 1300 may be bonded to the second planar top surface in a similar manner as discussed above with respect to the bonding of the second support substrate 1300 to the first planar top surface. In this embodiment, all other structures and methods of forming these structures are performed in a similar or same manner as discussed with the formation of the structure illustrated in FIG. 14.

FIG. 15 illustrates the optional underfill material 1501 deposited between the first external connectors 1405 and the package substrate 1450. The underfill material 1501 may reduce stress and protect the joints resulting from the reflowing of the first external connectors 1405. The underfill material 1501 may be formed by a capillary flow process after the first interposer 1425 and the package substrate 1450 are attached.

Figure 16:
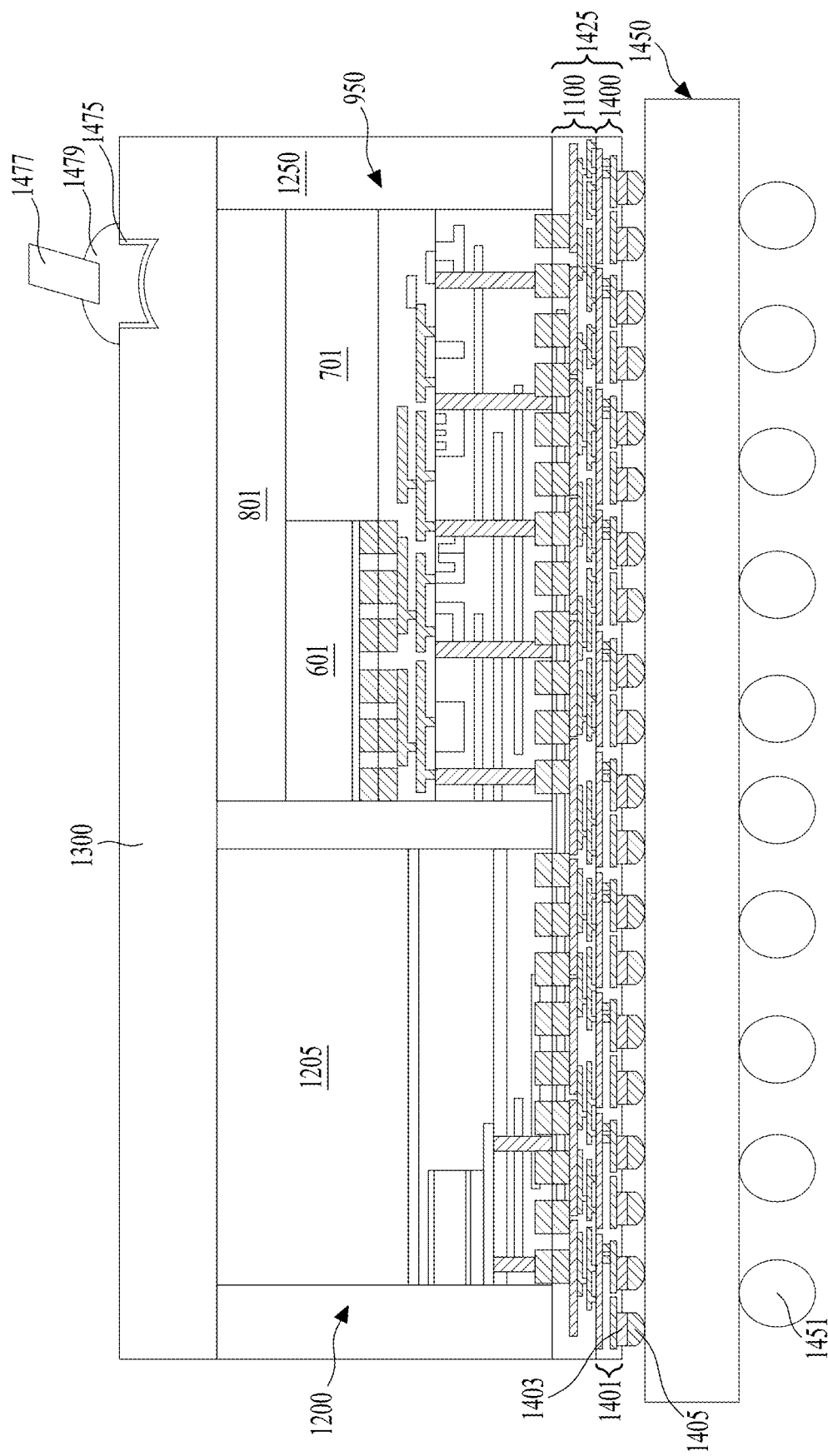
FIG. 16 illustrates an embodiment of a first optical package with the top support structure and a thinned optical package interposer with an additional support structure over the optical device within the first optical package, in accordance with some embodiments.

FIG. 16 illustrates another embodiment to the final structure illustrated in FIG. 14, wherein after the bonding the first optical device 950 to the first redistribution structure 1100 the second planarization process 1275 does not remove the second substrate 801. In this embodiment, the second planarization process 1275 planarizes top surfaces of the second substrate 801, the second gap-fill material 1250, and the first support substrate 1205, wherein after the second planarization process 1275 these top surfaces are substantially coplanar within process variations and may jointly be referred to as a third planar top surface. In this embodiment, the second support substrate 1300 may be bonded to the third planar top surface in a similar manner as discussed above with respect to the bonding of the second support substrate 1300 to the first planar top surface. Further, in this embodiment, the second substrate 801 may act and be referred to as a third support substrate. In this embodiment, all other structures and methods of forming these structures are performed in a similar or same manner as discussed with the formation of the structure illustrated in FIG. 14.

Embodiments discussed herein achieve benefits. In the embodiments discussed above, the use of the second support substrate 1300 allows for the removal of bulk silicon from the first interposer 1425 thereby improving the proximity of electrical connections to the optical devices (e.g., the first optical device 950 and the second optical device 1050) and the laser die 1200 from the package substrate 1450 through the first interposer 1425. By supporting the optical package from above with the second support substrate 1300 the first interposer 1425 may be thinned removing the need for long via metal routing through the first interposer 1425 thereby greatly mitigating the effects of electrical loss and parasitic capacitance caused by through silicon vias through the bulk silicon in typical interposers. Additionally, these mitigated negative effects and improved proximity of electrical features to the functional devices facilitates improved high speed operation and higher data rate transmission. Also, by removing the need for the through silicon vias through the first interposer 1425, the risk of damage caused by the formation of these vias to the first interposer 1425 is eliminated. Additionally, the use of support substrates (e.g., the first support substrate 1305, and the second substrate 801, acting as the third support substrate) allows for individual optimization of the optical devices and of the laser die prior to integration onto the first interposer 1425. Additionally, the support provided by disposing the functional devices (e.g., the laser die 1200 and the optical devices) between the first interposer 1425 and the second support substrate 1300 in conjunction with the utilization of the second gap-fill material 1250 eliminates the need for a structural molding compound and provides for a more uniform package structure.

In accordance with an embodiment, a method of manufacturing an integrated circuit device includes forming a first redistribution structure over a first silicon substrate, bonding an optical engine to the first redistribution structure, attaching a second silicon substrate to a top surface of the optical engine, and removing the first silicon substrate. In an embodiment, wherein the removing the first silicon substrate includes removing a first portion of the first silicon substrate through a grinding process, and removing a second portion of the first silicon substrate through a chemical-mechanical polish process. In an embodiment, further including forming conductive connectors coupled to the first redistribution structure, and attaching the conductive connectors to a substrate. In an embodiment, further including, bonding a laser device to the first redistribution structure, and during the attaching the second silicon substrate to the optical engine attaching the second silicon substrate to the laser device. In an embodiment, wherein the first redistribution structure optically couples the laser device to the optical engine. In an embodiment, further including encapsulating the optical engine in an insulating material, wherein after the attaching the second silicon substrate the insulating material is disposed between the first redistribution structure and the second silicon substrate. In an embodiment, further including forming a lens within the second silicon substrate, the lens positioned above the optical engine.

In accordance with an embodiment, an optical device includes an optical package having a first surface and a second surface opposite the first surface, a laser die package having a third surface and a fourth surface opposite the third surface, wherein the first surface is aligned with the third surface and the second surface is aligned with the fourth surface, a first silicon support attached to both the second surface and the fourth surface, and an interposer attached to both the first surface and the third surface, wherein the interposer is free of a silicon substrate. In an embodiment, wherein the first surface is planar with the third surface and the second surface is planar with the fourth surface. In an embodiment, further including a first insulating material encapsulating both the optical package and the laser die package, wherein the first insulating material spans from the interposer to the first silicon support. In an embodiment, wherein the laser die package includes a laser diode, and a second silicon support over the laser diode opposite the interposer, wherein the second silicon support has the fourth surface. In an embodiment, wherein the optical package includes an optical interposer attached to the interposer, an electronic integrated circuit (EIC) bonded to the optical interposer opposite the interposer, a third silicon support over the EIC, wherein the third silicon support has the fourth surface, and a second insulating material encapsulating the EIC, wherein the second insulating material spans from the optical interposer to the third silicon support. In an embodiment, wherein the optical package includes an electronic integrated circuit (EIC), wherein the EIC has a same width as the optical package. In an embodiment, wherein the first silicon support has a thickness in a range of 700 millimeters to 1,500 millimeters.

In accordance with an embodiment, a method of manufacturing an integrated circuit device includes forming a first redistribution structure over a first silicon substrate, bonding an optical package to the first redistribution structure, bonding a laser die to the first redistribution structure, encapsulating the optical package and the laser die in an insulating material, planarizing the insulating material, the optical package, and the laser die forming a planar surface, attaching a second silicon substrate to the planar surface, and removing the first silicon substrate. In an embodiment, wherein the removing the first silicon substrate includes removing a first portion of the first silicon substrate through a grinding process, and removing a second portion of the first silicon substrate through a chemical-mechanical polish process. In an embodiment, further including forming an optical lens within the second silicon substrate over the optical package, and attaching an optical fiber adjacent to the optical lens. In an embodiment, further including after removing the first silicon substrate, forming a second redistribution structure over the first redistribution structure. In an embodiment, wherein the first redistribution structure and the second redistribution structure are both free from a silicon substrate. In an embodiment, further including forming micro-bumps on conductive features of the second redistribution structure, bonding the micro-bumps to a substrate, and forming external connectors on an opposite side of the substrate from the micro-bumps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit device, the method comprising:
   forming a first redistribution structure over a first silicon substrate;
   bonding an optical engine to the first redistribution structure;
   attaching a second silicon substrate to a top surface of the optical engine; and
   removing the first silicon substrate.

2. The method of claim 1, wherein removing the first silicon substrate comprises:

removing a first portion of the first silicon substrate through a grinding process; and removing a second portion of the first silicon substrate through a chemical-mechanical polish process.

3. The method of claim 1, further comprising:

forming conductive connectors coupled to the first redistribution structure; and attaching the conductive connectors to a substrate.

4. The method of claim 1, further comprising:

bonding a laser device to the first redistribution structure; and during attaching the second silicon substrate to the optical engine attaching the second silicon substrate to the laser device.

5. The method of claim 4, wherein the first redistribution structure optically couples the laser device to the optical engine.

6. The method of claim 1, further comprising encapsulating the optical engine in an insulating material, wherein after attaching the second silicon substrate the insulating material is disposed between the first redistribution structure and the second silicon substrate.

7. The method of claim 1, further comprising forming a lens within the second silicon substrate, the lens positioned above the optical engine.

8. An optical device comprising:

an optical package having a first surface and a second surface opposite the first surface;

a laser die package having a third surface and a fourth surface opposite the third surface, wherein the first surface is aligned with the third surface and the second surface is aligned with the fourth surface;

a first silicon support attached to both the second surface and the fourth surface; and an interposer attached to both the first surface and the third surface, wherein the interposer is free of a silicon substrate.

9. The device of claim 8, wherein the first surface is planar with the third surface and the second surface is planar with the fourth surface.

10. The device of claim 8, further comprising a first insulating material encapsulating both the optical package and the laser die package, wherein the first insulating material spans from the interposer to the first silicon support.

11. The device of claim 10, wherein the laser die package comprises:

a laser diode; and a second silicon support over the laser diode opposite the interposer, wherein the second silicon support has the fourth surface.

12. The device of claim 11, wherein the optical package comprises:

an optical interposer attached to the interposer;

an electronic integrated circuit (EIC) bonded to the optical interposer opposite the interposer;

a third silicon support over the EIC, wherein the third silicon support has the fourth surface; and a second insulating material encapsulating the EIC, wherein the second insulating material spans from the optical interposer to the third silicon support.

13. The device of claim 8, wherein the optical package comprises an electronic integrated circuit (EIC), wherein the EIC has a same width as the optical package.

14. The device of claim 8, wherein the first silicon support has a thickness in a range of 700 millimeters to 1,500 millimeters.

15. A method of manufacturing an integrated circuit device, the method comprising:

forming a first redistribution structure over a first silicon substrate;

bonding an optical package to the first redistribution structure;

bonding a laser die to the first redistribution structure;

encapsulating the optical package and the laser die in an insulating material;

planarizing the insulating material, the optical package, and the laser die forming a planar surface;

attaching a second silicon substrate to the planar surface; and removing the first silicon substrate.

16. The method of claim 15, wherein removing the first silicon substrate comprises:

removing a first portion of the first silicon substrate through a grinding process; and removing a second portion of the first silicon substrate through a chemical-mechanical polish process.

17. The method of claim 15, further comprising:

forming an optical lens within the second silicon substrate over the optical package; and attaching an optical fiber adjacent to the optical lens.

18. The method of claim 15, further comprising, after removing the first silicon substrate, forming a second redistribution structure over the first redistribution structure.

19. The method of claim 18, wherein the first redistribution structure and the second redistribution structure are both free from a silicon substrate.

20. The method of claim 18, further comprising:

forming micro-bumps on conductive features of the second redistribution structure;

bonding the micro-bumps to a substrate; and forming external connectors on an opposite side of the substrate from the micro-bumps.

\* \* \* \* \*